(12) United States Patent
Chen et al.

(10) Patent No.: US 7,683,427 B2
(45) Date of Patent: Mar. 23, 2010

(54) LATERALLY DIFFUSED METAL-OXIDE-SEMICONDUCTOR DEVICE AND METHOD OF MAKING THE SAME

(75) Inventors: Chin-Lung Chen, Hsinchu County (TW); Wen-Kuo Li, Taoyuan County (TW)

(73) Assignee: United Microelectronics Corp., Hsin-Chu (TW)

( * ) Notice: Subject to any disclaimer, the term of this patent is extended or adjusted under 35 U.S.C. 154(b) by 79 days.

(21) Appl. No.: 11/857,437

(22) Filed: Sep. 18, 2007

(65) Prior Publication Data

US 2009/0072308 A1   Mar. 19, 2009

(51) Int. Cl.
*H01L 29/76* (2006.01)
(52) U.S. Cl. ............... 257/343; 257/411; 257/E29.256; 257/E29.261
(58) Field of Classification Search ................. 257/343, 257/411, E29.256, E29.261
See application file for complete search history.

(56) References Cited

U.S. PATENT DOCUMENTS

| 6,707,112 | B2 * | 3/2004 | Kachelmeier | 257/368 |
| 6,797,549 | B2 | 9/2004 | Hebert | |
| 6,825,531 | B1 | 11/2004 | Mallikarjunaswamy | |
| 6,897,525 | B1 * | 5/2005 | Kikuchi et al. | 257/343 |
| 2007/0228463 | A1 * | 10/2007 | Cai | 257/343 |

* cited by examiner

*Primary Examiner*—Mark Prenty
(74) *Attorney, Agent, or Firm*—Winston Hsu (57) ABSTRACT

A laterally diffused metal-oxide-semiconductor (LDMOS) device as well as a method of making the same is disclosed. A gate is formed on a semiconductor substrate between a source region and a drain region with one side laterally extending onto a part of a field oxide layer and the opposite side beside the source region. A gate dielectric layer is formed between the gate and the semiconductor substrate, wherein the gate dielectric layer comprises two or more portions having different thicknesses arranged laterally in a way that the thicknesses of the portions gradually increase from one side beside the source doping region to the opposite side bordering the field oxide layer. With such structure, the hot carrier impact is minimized and the gate length can be scaled down to gain $I_{dlin}$.

14 Claims, 8 Drawing Sheets

LATERALLY DIFFUSED METAL-OXIDE-SEMICONDUCTOR DEVICE AND METHOD OF MAKING THE SAME

BACKGROUND OF THE INVENTION

1. Field of the Invention

The present invention relates to a laterally diffused metal-oxide-semiconductor (LDMOS) device and, more particularly, to a LDMOS device with a reduced hot carrier injection effect.

2. Description of the Prior Art

Power MOS devices, including laterally diffused metal-oxide-semiconductor (LDMOS) devices, are employed in a variety of applications, such as, for example, power amplifiers in wireless communications systems. Especially, LDMOS device using $V_g$, (gate voltage)=5V seems to become a main stream in the application. The $V_d$, (drain voltage) of such LDMOS may be a various voltage depending on device's application.

Figure 1:
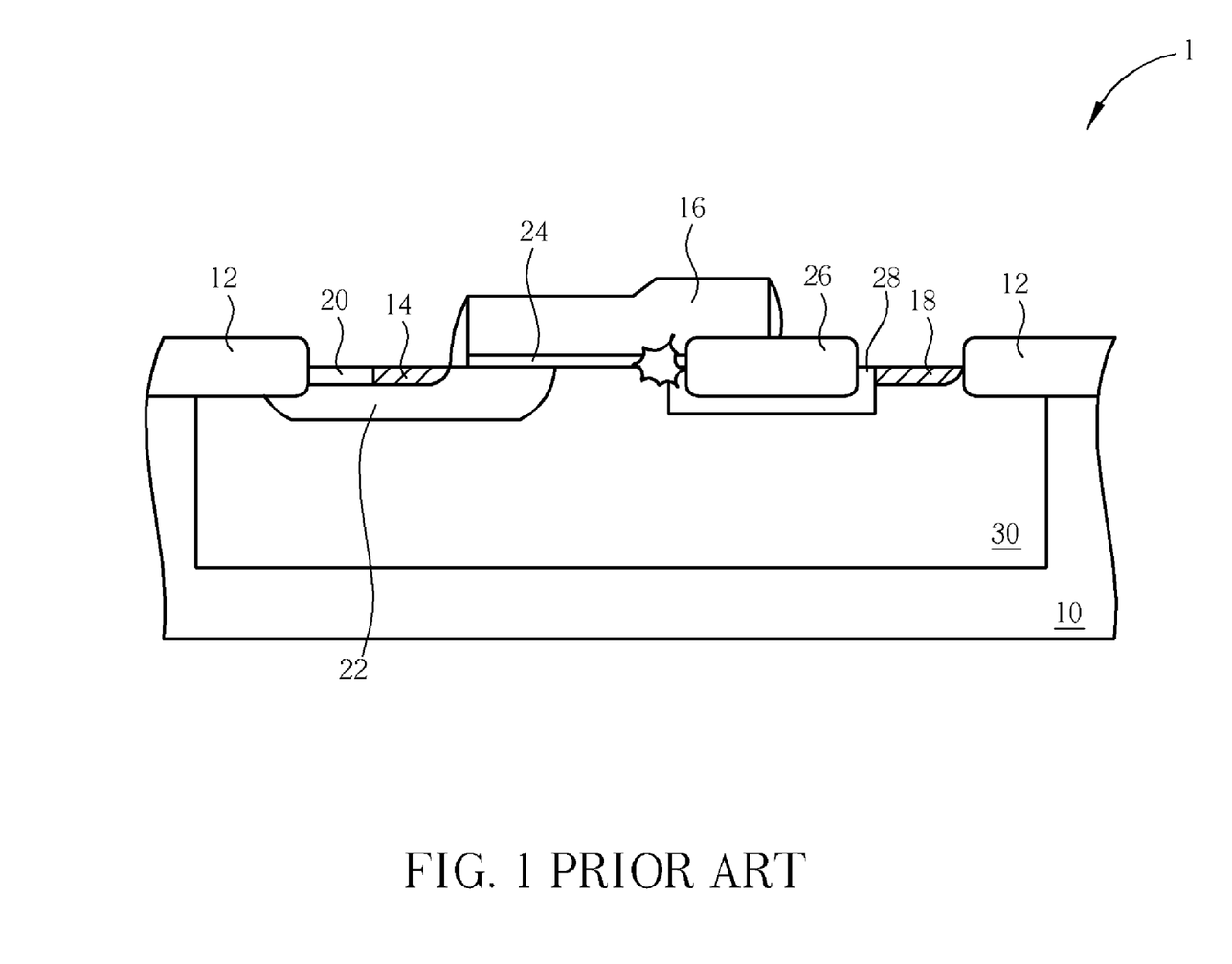
FIG. 1 schematically illustrates a cross-sectional view of a conventional LDNMOS device.

FIG. 1 schematically illustrates a cross-sectional view of a conventional laterally diffused NMOS device. The conventional laterally diffused NMOS device 1 is fabricated on an active area of a semiconductor substrate 10 such as a P-type semiconductor substrate. The active area is isolated by a peripheral field oxide layer 12. Generally, the NMOS device 1 comprises a source doping region 14, a gate 16 and a drain doping region 18. The source doping region 14 is a heavily N-doped region bordering a heavily P-doped region 20, both of which are formed within a P-body region 22. The distance between the drain doping region 18 and the source doping region 14 may be a few micrometers. The drain doping region 18 is a heavily N-doped drain. A gate dielectric layer 24 is formed beneath the gate 16. The gate 16 is formed on the gate dielectric layer 24 and laterally extends over a field oxide layer 26. The field oxide layer 26 is formed in a N-doped drift region 28 between drain diffusion and channel diffusion using a local oxidation of silicon (LOCOS) technique. To prevent breakdown of the MOS device operated at a high voltage, the field oxide layer 26 requires a certain thickness. The P-body region 22, the drift region 28, and the drain doping region 18 are all formed within a deep N-well 30 in the semiconductor substrate 10.

However, in the conventional LDMOS, since the thickness of the gate dielectric layer (gate oxide) on the channel diffusion always keeps the same in the whole, a trade off phenomenon is faced:

1. In order to lower $V_t$, (threshold voltage) of LDMOS or increase $I_{dlin}$, (linear drive current), a thin gate dielectric layer is preferred in the channel region.

2. Following the term 1,, a serious hot carrier injection (HCI) issue will occur, leading the device to burn out in advance.

HCI in an MOS device generally results from heating and subsequent injection of carriers into the gate oxide of the device, which results in a localized and non-uniform buildup of interface states and oxide charges near and underneath a gate of the device. As is well known in the art, the buildup of interface states, which are typically defined as trapped charges in an interface between an upper surface of the semiconductor substrate and an oxide layer formed on the substrate, generally results from a high electric field distribution proximate the silicon/oxide interface. This phenomenon can produce variations in certain characteristics of the MOS device, including threshold voltage, transconductance, drain current, etc., thus undesirably affecting the performance and reliability of the device. It is well known that HCI is a strong function of the internal electric field distributions at the silicon/oxide interface of the MOS device.

Currently, an increased field oxidation layer (FOX) width or an offset of drain side to the gate is used in order to decrease hot carrier injection issue, thus the device pitch is enlarged and $I_{dlin}$, performance is deteriorated, and finally a high $R_{dson}$, (drain-source on-state resistance) is caused, and the performance and reliability of the device are undesirably affected.

Therefore, there is still a need for an improved LDMOS structure and the manufacturing method to reduce the hot carrier effect.

SUMMARY OF THE INVENTION

An objective of the present invention is to provide a laterally diffused metal-oxide-semiconductor (LDMOS) device and a method of making the LDMOS device. In the LDMOS of the present invention, hot carrier impact is minimized and $I_{dlin}$, is increased.

In accordance with one aspect of the present invention, the LDMOS comprises a semiconductor substrate; a source region comprising a source doping region and a first doping region encompassed by a body region formed in the semiconductor substrate; a drain region formed in the semiconductor substrate; a first field oxide layer formed on a drift region in the semiconductor substrate between the source region and the drain region and on a side of the drain region; a gate structure formed on the semiconductor substrate between the source region and the drain region with one side laterally extending onto a part of the first field oxide layer and the opposite side beside the source doping region; and a gate dielectric layer formed between the gate structure and the semiconductor substrate, wherein the gate dielectric layer comprises a first portion having a first thickness and a second portion having a second thickness greater than the first thickness, the first portion and the second portion are arranged in a lateral direction, and the second portion borders the first field oxide layer.

In accordance with another aspect of the present invention, the LDMOS device comprises a semiconductor substrate; a source region comprising a source doping region and a first doping region encompassed by a body region formed in the semiconductor substrate; a drain region formed in the semiconductor substrate; a first field oxide layer formed on a drift region in the semiconductor substrate between the source region and the drain region and on a side of the drain region; a gate structure formed on the semiconductor substrate between the source region and the drain region with one side laterally extending onto a part of the first field oxide layer and the opposite side beside the source doping region; and a gate dielectric layer formed between the gate structure and the semiconductor substrate, wherein the gate dielectric layer comprises a plurality of portions having different thicknesses arranged laterally in a way that the thicknesses of the portions gradually increase from one side beside the source doping region to the opposite side bordering the first field oxide layer.

In accordance with still another aspect of the present invention, the method of making an LDMOS device comprises providing a semiconductor substrate of first conductivity type; performing a first ion implantation to form a deep well of second conductivity type; performing a second ion implantation to form a drift region of second conductivity type; forming a first field oxide layer within the drift region; forming a first dielectric layer on the semiconductor substrate; removing a portion of the first dielectric layer over a body region to be in the semiconductor substrate; performing a third ion implantation to form a body region of first conductivity type; forming a second dielectric layer on the semiconductor substrate over the body region and bordering the first dielectric layer, wherein the second dielectric layer has a thickness thinner than that of the first dielectric layer; forming a gate structure on the first dielectric layer and the second dielectric layer and extending laterally onto a part of the first field oxide layer; performing a fourth ion implantation to form a source doping region of second conductivity type in the body region beside the gate structure and a drain doping region of second conductivity type in the semiconductor substrate on a side of the first field oxide layer; performing a fifth ion implantation to form a first doping region of first conductivity type in the body region bordering the source doping region.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
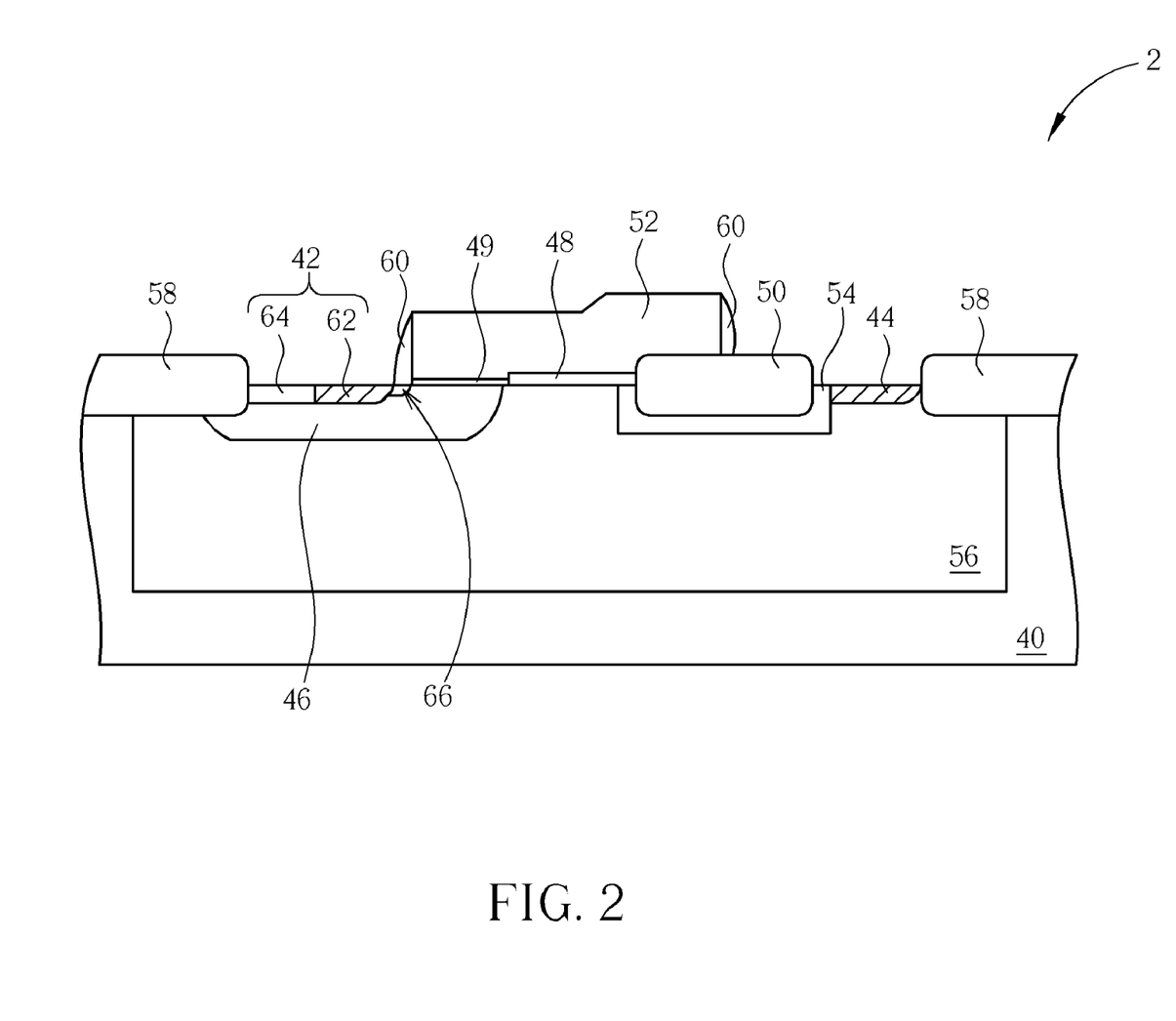
FIG. 2 is a schematic cross-sectional diagram illustrating the LDNMOS device according to the present invention.

FIG. 2 is a schematic cross-sectional diagram illustrating the LDNMOS device in accordance with one preferred embodiment of this invention. It is understood that the electric polarities shown in figures are exemplary, and suitable modification of the polarities can be made to form an LDPMOS device.

According to the preferred embodiment, the LDNMOS device 2 is formed on an active area of a semiconductor substrate 40 such as a P-type silicon substrate and a deep N-well 56 may be formed in the P-type silicon substrate, or a semiconductor substrate such as an N-type silicon substrate may be used. The active area is defined and isolated with a peripheral field oxide layer 58. The LDNMOS device 2 comprises a source region 42, a gate 52 and a drain 44. The source region 42 may further comprise a heavily N-doped source doping region 62 and a heavily P-doped region 64 bordering each other, both of which are formed within a P-body 46. The drain 44 may be a heavily N-doped drain doping region. A gate dielectric layer including a portion 48 and a portion 49 is formed on the surface of the P-body 46 and the deep N-well 56. The gate 52 is formed on the portion 48 and the portion 49 of the gate dielectric layer and laterally extends over a part of a field oxide layer 50. The field oxide layer 50 is formed in an N-drift region 54 formed in the deep N-well 56. A spacer 60 may be formed on the sidewall of the gate 52. A lightly doped region 66 may be further formed in the semiconductor substrate as an extension region.

The gate 52 may be made of polysilicon or metals. The gate dielectric layer may be made of a silicon oxide compound, such as silicon dioxide, or other dielectric materials. The N-type region may be a region doped with N-type dopants, such as arsenic, antimony, or phosphorus. The P-type region may be a region doped with P-type dopants, such as boron, beryllium, indium or magnesium.

In the present invention, the gate dielectric layer includes a portion 48 and a portion 49. For example, the portion 49 may have a thinner thickness of 135 Å, and the portion 48 bordering the field oxide layer 50 is thicker than the portion 49 and may be 300 Å. The relatively large thickness may help the LDNMOS to decrease the hot carrier injection effect, which in turn helps to scale down the gate length. Accordingly, not only has device pitch been scaled down, but also $I_{dlin}$, can be increased due to the thinner portion of the dielectric layer. Therefore, the $R_{dson}$, (unit=mohm×mm$^2$) can be improved much. Such LDMOS structure can be easily made without affecting original devices.

The position of the border between the portions 48 and 49 is not particularly limited. That is, the portion 48 may be over the border between the P-body 46 and the semiconductor substrate 40; the portion 49 may be over the border between the P-body 46 and the semiconductor substrate 40; or the border between the portions 48 and 49 is on the border between the P-body 46 and the semiconductor substrate 40.

With respect to another aspect of the present invention, the gate dielectric layer may include a dielectric layer having two portions as described above as well as a dielectric layer having a plurality of portions having different thicknesses arranged laterally in such way that the thicknesses of the portions gradually increased from one side beside the source doping region to the opposite side bordering the field oxide layer. As the portion of the gate dielectric layer bordering the field oxide layer is thick, the hot carrier injection effect is minimized.

Figure 3:
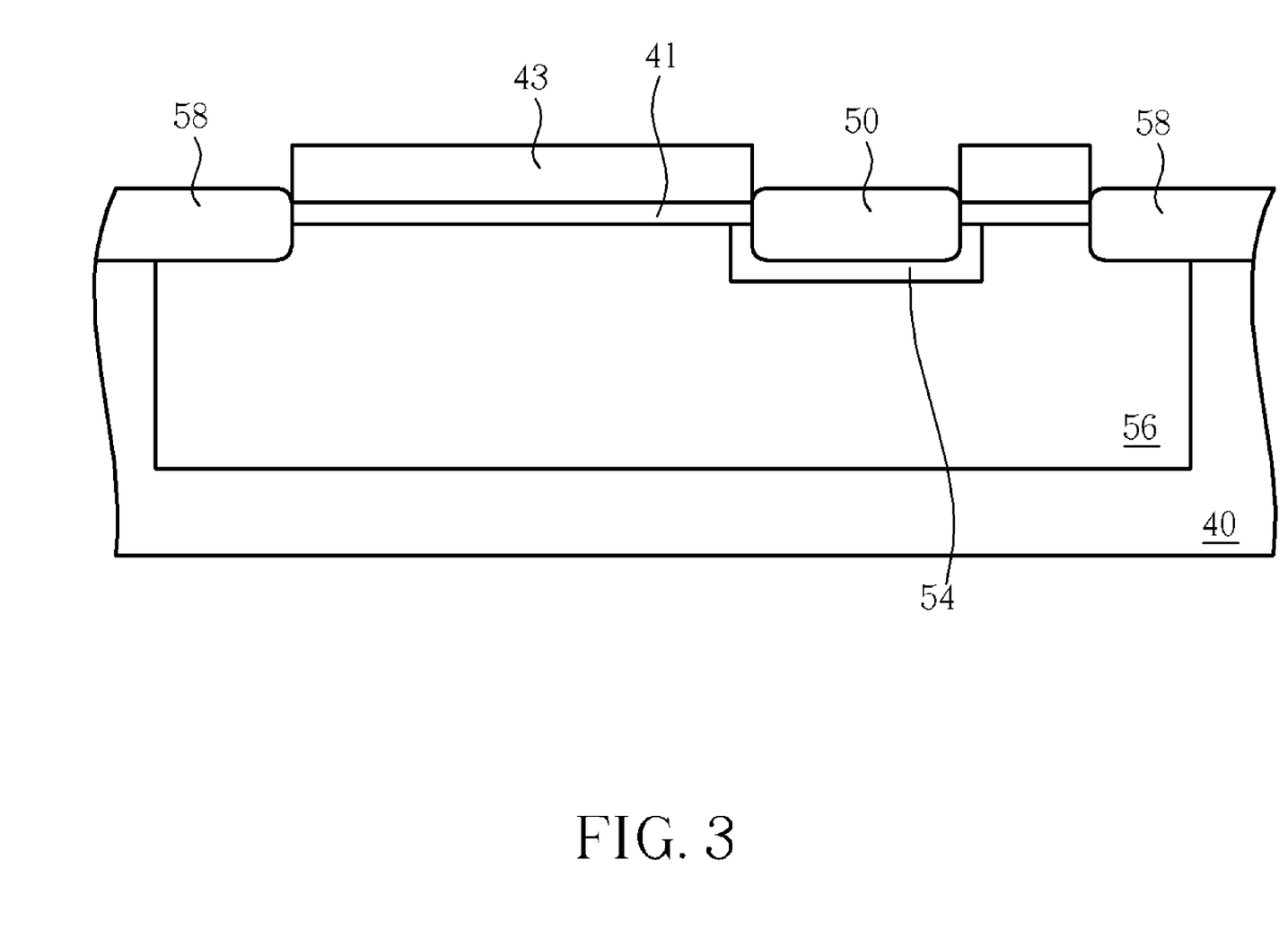
FIGS. 3-8 are schematic cross-sectional diagrams illustrating the method of making an LDMOS device according to the present invention.

Referring to FIGS. 3-8, the method of making an LDNMOS device according to the invention is illustrated. As shown in FIG. 3, a semiconductor substrate 40 of P-type is provided. The deep N-well 56, which may be a high voltage N-type well (HV N-well) may be formed using conventional processing steps. An HV N-well implant is typically a deep implant and is generally more lightly doped relative to a CMOS N-well. A pad oxide layer 41 and a nitride layer 43 is deposited blanketly and patterned to expose the regions to be a drift region and further an isolation region for the LDMOS device if desired. An ion implantation is performed to form an N-drift region 54 in the deep N-well 56 using the nitride layer as a mask. The N-drift region 54 is a more heavily doped N-type region than the N-well 56. Thereafter, a field oxide layer 50 is formed in the N-drift region 54. The field oxide layer 50 may be formed using a LOCOS process or an STI process. A field oxide layer 58 serving as an isolation structure may be formed simultaneously with the formation of the field oxide layer 50.

Figure 4:
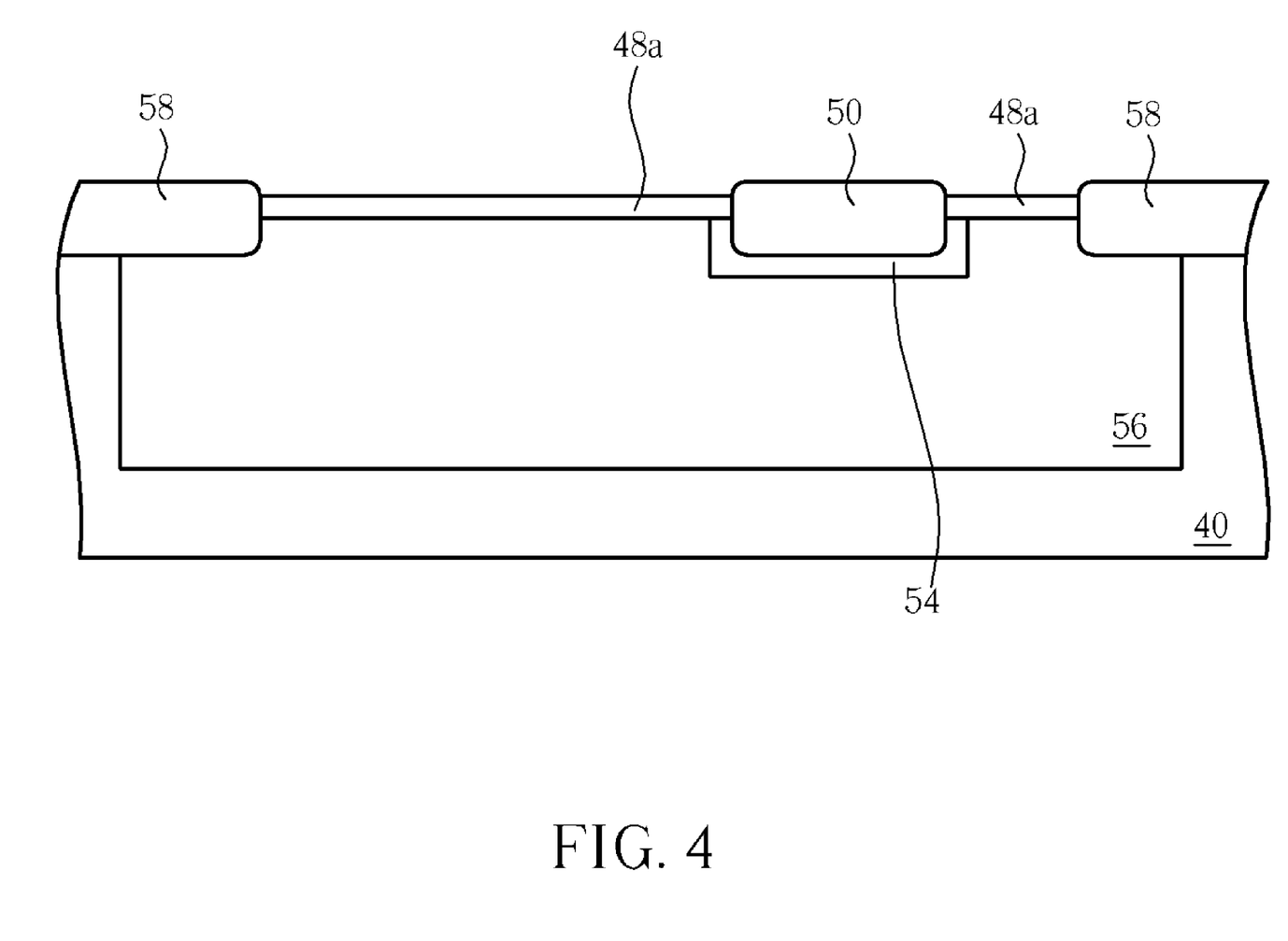

As shown in FIG. 4, after the nitride layer 43 and the pad oxide layer 41 are removed, a dielectric layer 48a, is formed on the semiconductor substrate 40 preferably by a thermal oxidation process. Or the dielectric layer 48a, may be an oxide layer deposited using a CVD (chemical vapor deposition) process.

Figure 5:
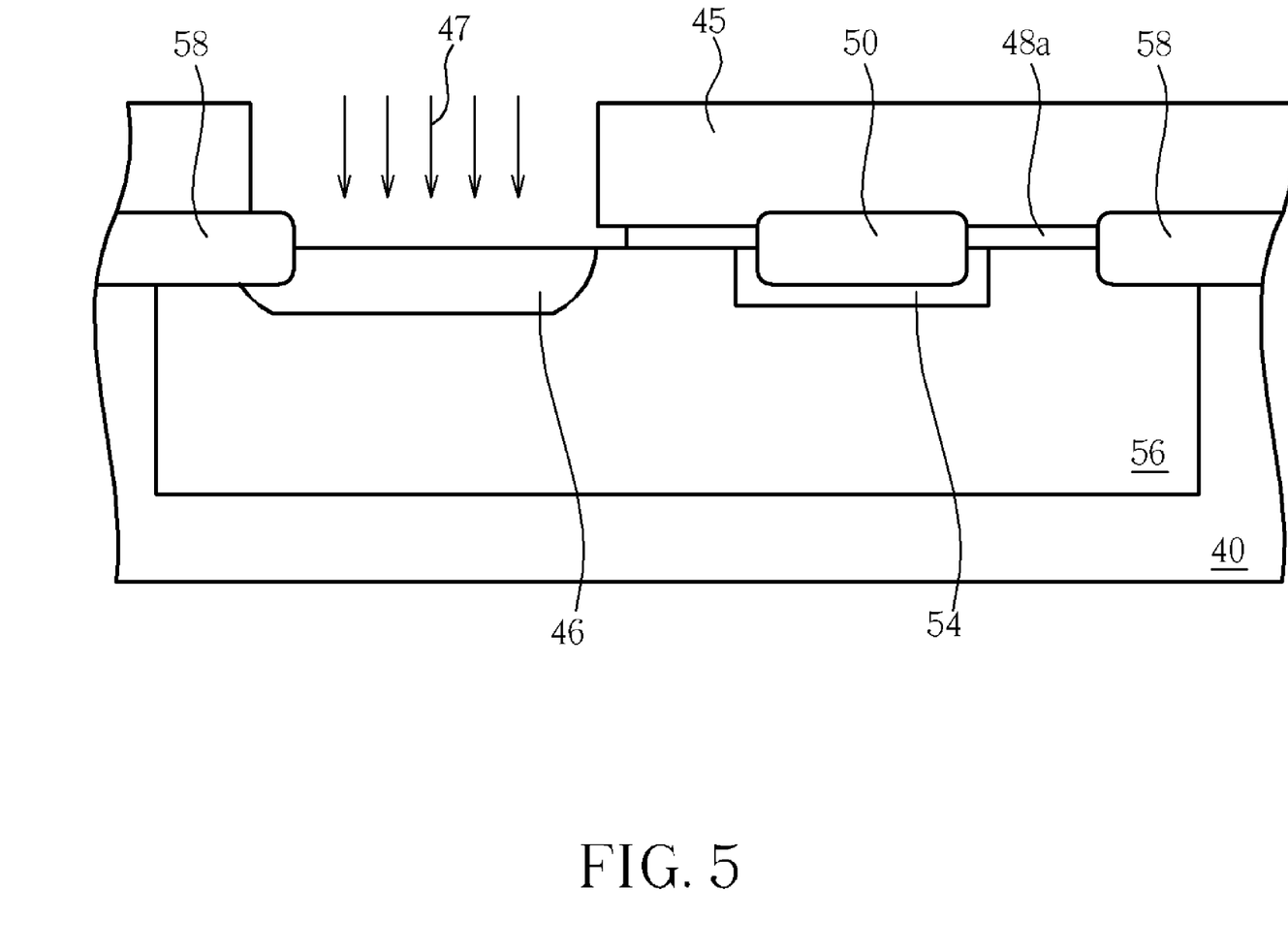

As shown in FIG. 5, a portion of the dielectric layer 48a, over a portion of the semiconductor substrate 40 is removed. The portion of the semiconductor substrate 40 will be formed as a P-body 46 in subsequent processing steps. The removal is performed through forming a patterned photoresist layer 45 on the semiconductor substrate to expose the portion of the dielectric layer 48a, to be removed, and then a wet etching process is performed to remove the portion of the dielectric layer 48a, to be removed. By using the wet etching process, the part of the dielectric layer 48a, under the edge of the patterned photoresist layer 45 at the opening may be removed. The wet etching may use an etchant comprising water and HF in a ratio of 20:1, (v/v). Thereafter, an ion implantation 47 is performed on the semiconductor substrate 40 using the photoresist layer 45 as a mask to form a P-body 46.

Figure 6:
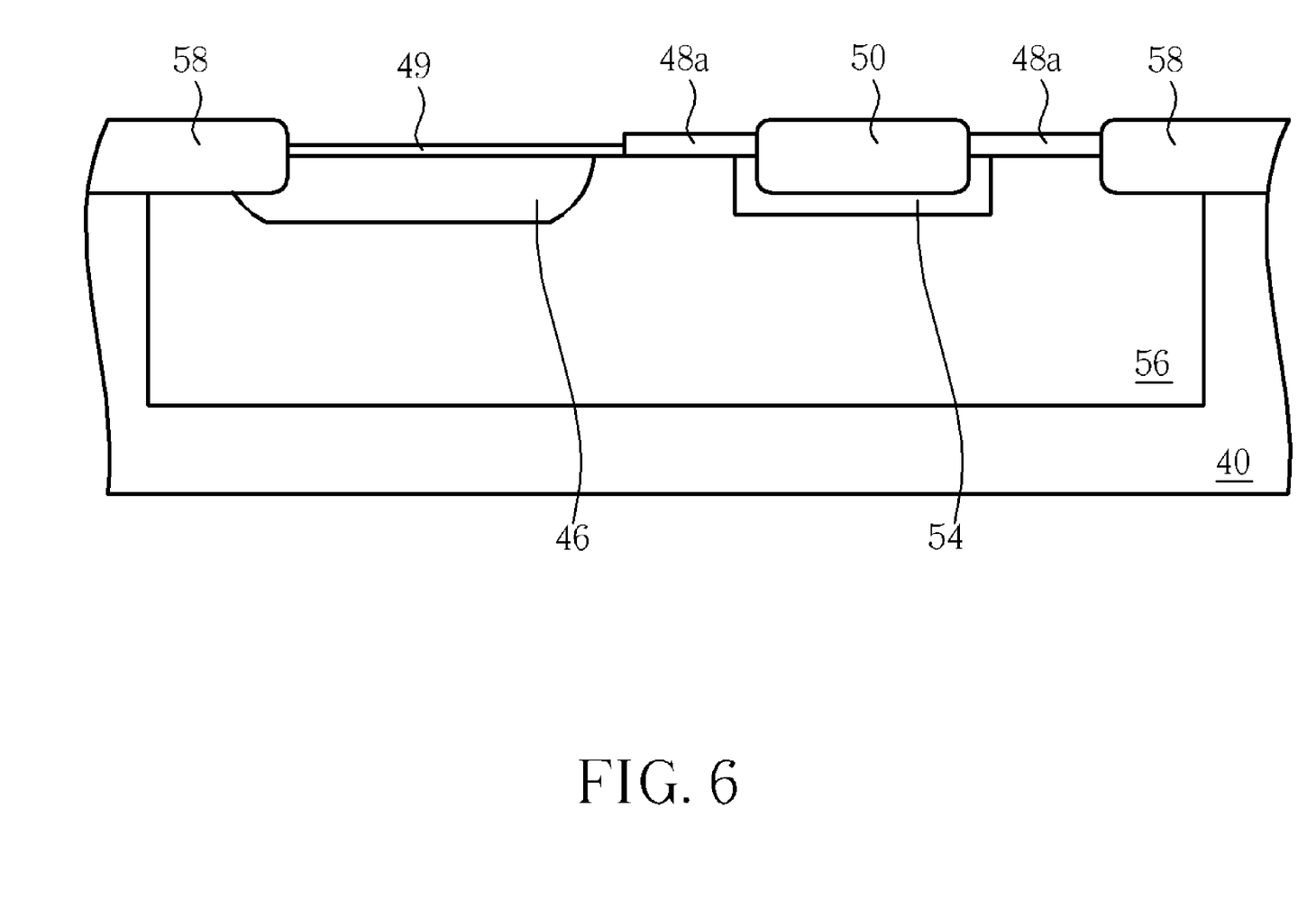
Figure 7:
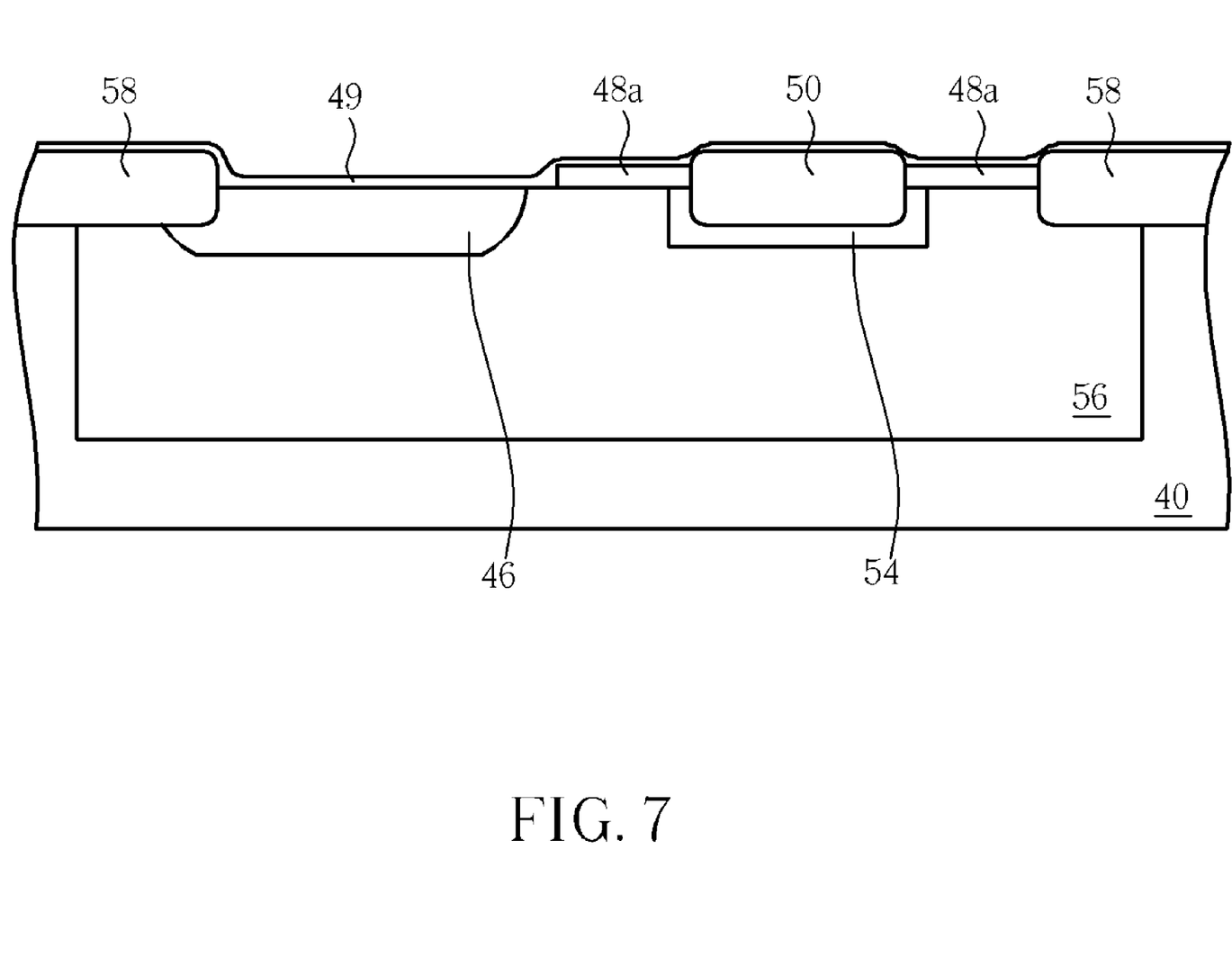

As shown in FIG. 6, the photoresist layer 45 is stripped, and the semiconductor substrate may be further cleaned using an RCA cleaning solution. Thereafter, a second dielectric layer 49 is formed on the semiconductor substrate over the body region 46 and bordering the dielectric layer 48a, by a thermal oxidation process. The dielectric layer 49 is formed such that it is thinner than the dielectric layer 48a. Due to using the thermal oxidation process, the increased thickness of the field oxide layers or the dielectric layer 48a, is not significant.

Alternatively, the dielectric layer 49 may be deposited only onto the surface of the p-body 46 by masking. Further alternatively, referring to FIG. 7, the dielectric layer 49 may be formed in such way that the dielectric layer 49 is deposited blanketly over the P-body 46 and over the dielectric layer 48a, by a LPCVD (low pressure CVD) process. In such situation, no matter the dielectric layer 49 is formed to be thinner than the dielectric layer 48a, or not, the portion resulted from the stack of the dielectric layer 49 on the dielectric layer 48a, is always thicker than the single electric layer 49.

Figure 8:
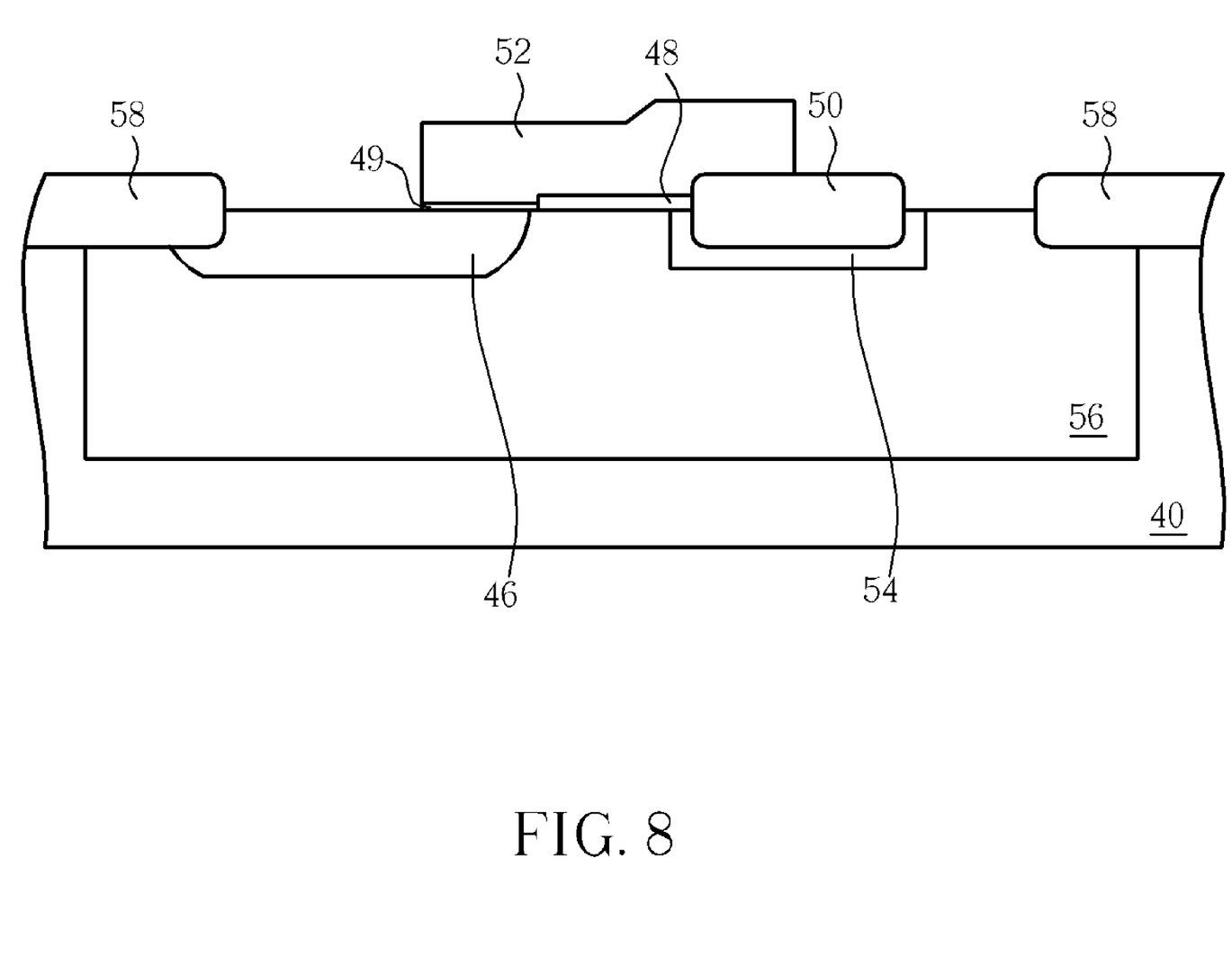

As shown in FIG. 8, a gate 52 is formed on the dielectric layer 48a, and the dielectric layer 49 and extending laterally onto a part of the field oxide layer 50 through forming a gate material layer on the semiconductor substrate and patterning the gate material layer by a photolithography process and an etching process. The part of the dielectric layers 49 and 48a, not beneath the gate 52 is removed, leaving a portion 49 and a portion 48 having different thicknesses serving as a gate dielectric layer between the gate 52 and the semiconductor substrate 40.

After the gate 52 is formed, a lightly doped region 66 may be further formed in the semiconductor substrate 40 in the p-body 46 using the gate 52 as a mask. A spacer 60 may be further formed on the sidewall of the gate 52. Thereafter, an ion implantation is performed to form a source doping region 62 in the body region beside the gate structure and a drain 44 in the semiconductor substrate 44 beside the field oxide layer 50. The source doping region 62 and the drain 44 are more heavily N-doped. Finally, an ion implantation is performed to form a heavily P-doped region 64 in the P-body 46 and bordering the source doping region 62, making an LDNMOS as shown in FIG. 2.

In comparison with the conventional technique, in the present invention, a dual gate dielectric layer is used to replace the conventional single dielectric layer in the LDMOS device. In the present invention, the thicker portion of the gate dielectric layer serves a function to minimize hot carrier impact and also keep N+ without offset to the poly gate, and the thinner portion of the gate dielectric layer serves a function to gain $I_{dlin}$. Due to the depth difference between the thinner portion and the thicker portion of the gate dielectric layer is not much as the voltage application to the gate is 5V only, the gate profile over the interface of this dual gate dielectric layer will not the problem. And this also applies to the gate dielectric layer having a plurality of portions of different thicknesses in another aspect of the present invention. By this approach, safe switch devices with very low $R_{dson}$, can be obtained for power management products.

All combinations and sub-combinations of the above-described features also belong to the present invention. Those skilled in the art will readily observe that numerous modifications and alterations of the device and method may be made while retaining the teachings of the invention.

What is claimed is:

1. A laterally diffused metal-oxide-semiconductor (LDMOS) device, comprising:
   a semiconductor substrate;
   a source region comprising a source doping region and a first doping region encompassed by a body region formed in the semiconductor substrate;
   a drain region formed in the semiconductor substrate;
   a first field oxide layer formed on a drift region in the semiconductor substrate between the source region and the drain region and on a side of the drain region;
   a gate structure formed on the semiconductor substrate between the source region and the drain region with one side laterally extending onto a part of the first field oxide layer and the opposite side beside the source doping region; and
   a gate dielectric layer formed between the gate structure and the semiconductor substrate, wherein the gate dielectric layer comprises a first portion having a first thickness and a second portion having a second thickness greater than the first thickness, the first portion and the second portion are arranged in a lateral direction, the second portion borders the first field oxide layer, and the second portion of the gate dielectric layer is over a border between the body region and the semiconductor substrate.

2. The LDMOS device of claim 1, wherein, the first doping region is P-type, the source doping region is N-type, the body region is P-type, the drain region is N-type, the drift region is N-type, and the semiconductor substrate is N-type.

3. The LDMOS device of claim 1, wherein, the first doping region is P-type, the source doping region is N-type, the body region is P-type, the drain region is N-type, the drift region is N-type, the semiconductor substrate is P-type, and a deep N-type well is further formed in the semiconductor substrate to encompass the first doping region, the source doping region, the body region, the drain region, and the drift region.

4. The LDMOS device of claim 1, wherein, the first doping region is N-type, the source doping region is P-type, the body region is N-type, the drain region is P-type, the drift region is P-type, and the semiconductor substrate is P-type.

5. The LDMOS device of claim 1, wherein, the first doping region is N-type, the source doping region is P-type, the body region is N-type, the drain region is P-type, the drift region is P-type, the semiconductor substrate is N-type, and a deep P-type well is further formed in the semiconductor substrate to encompass the first doping region, the source doping region, the body region, the drain region, and the drift region.

6. The LDMOS device of claim 1, wherein, the gate structure comprises a gate electrode and a spacer on the sidewall of the gate electrode.

7. The LDMOS device of claim 6, further comprising an extension region in the semiconductor substrate on a side of the source doping region.

8. A laterally diffused metal-oxide-semiconductor (LDMOS) device, comprising:
   a semiconductor substrate;
   a source region comprising a source doping region and a first doping region encompassed by a body region formed in the semiconductor substrate;
   a drain region formed in the semiconductor substrate;
   a first field oxide layer formed on a drift region in the semiconductor substrate between the source region and the drain region and on a side of the drain region;
   a gate structure formed on the semiconductor substrate between the source region and the drain region with one side laterally extending onto a part of the first field oxide layer and the opposite side beside the source doping region; and a gate dielectric layer formed between the gate structure and the semiconductor substrate, wherein the gate dielectric layer comprises a first portion having a first thickness and a second portion having a second thickness greater than the first thickness, the first portion and the second portion are arranged in a lateral direction, the second portion borders the first field oxide layer, and a border between the first portion of the gate dielectric layer and the second portion of the gate dielectric layer is on a border between the body region and the semiconductor substrate.

9. The LDMOS device of claim 8, wherein, the first doping region is P-type, the source doping region is N-type, the body region is P-type, the drain region is N-type, the drift region is N-type, and the semiconductor substrate is N-type.

10. The LDMOS device of claim 8, wherein, the first doping region is P-type, the source doping region is N-type, the body region is P-type, the drain region is N-type, the drift region is N-type, the semiconductor substrate is P-type, and a deep N-type well is further formed in the semiconductor substrate to encompass the first doping region, the source doping region, the body region, the drain region, and the drift region.

11. The LDMOS device of claim 8, wherein, the first doping region is N-type, the source doping region is P-type, the body region is N-type, the drain region is P-type, the drift region is P-type, and the semiconductor substrate is P-type.

12. The LDMOS device of claim 8, wherein, the first doping region is N-type, the source doping region is P-type, the body region is N-type, the drain region is P-type, the drift region is P-type, the semiconductor substrate is N-type, and a deep P-type well is further formed in the semiconductor substrate to encompass the first doping region, the source doping region, the body region, the drain region, and the drift region.

13. The LDMOS device of claim 8, wherein, the gate structure comprises a gate electrode and a spacer on the sidewall of the gate electrode.

14. The LDMOS device of claim 13, further comprising an extension region in the semiconductor substrate on a side of the source doping region.

* * * * *